United States Patent
Huang et al.

(10) Patent No.: US 7,999,195 B2
(45) Date of Patent: Aug. 16, 2011

(54) CIRCUIT BOARD HAVING ISOLATION COVER AND ASSEMBLING METHOD THEREOF

(75) Inventors: Chung-Shao Huang, Taipei County (TW); Ching-Feng Hsieh, Taipei (TW); Jen-Huan Yu, Taipei (TW); Cheng-Wen Dai, Taipei (TW); Kuo-Ching Chen, Taipei (TW)

(73) Assignee: Askey Computer Corp., Taipei (TW)

( * ) Notice: Subject to any disclaimer, the term of this patent is extended or adjusted under 35 U.S.C. 154(b) by 225 days.

(21) Appl. No.: 12/341,560

(22) Filed: Dec. 22, 2008

(65) Prior Publication Data

US 2010/0091471 A1 Apr. 15, 2010

(30) Foreign Application Priority Data

Oct. 13, 2008 (TW) ................................ 97139173 A

(51) Int. Cl.
*H05K 9/00* (2006.01)
(52) U.S. Cl. ................... 174/382; 174/384; 361/816
(58) Field of Classification Search .................. 174/377, 174/382, 384; 361/816, 818
See application file for complete search history.

(56) References Cited

U.S. PATENT DOCUMENTS

| 5,014,160 | A * | 5/1991 | McCoy, Jr. ................ 361/818 |
| 5,717,577 | A * | 2/1998 | Mendolia et al. ........... 361/818 |
| 6,687,135 | B1 * | 2/2004 | Kitade ....................... 361/816 |
| 6,781,851 | B2 * | 8/2004 | Daoud et al. .............. 361/818 |
| 2004/0025334 | A1 * | 2/2004 | Wen et al. ................. 29/832 |
| 2008/0043453 | A1 | 2/2008 | Horng |

FOREIGN PATENT DOCUMENTS

CN 201063966 Y 5/2008

* cited by examiner

*Primary Examiner* — Hung Ngo
(74) *Attorney, Agent, or Firm* — Rabin & Berdo, P.C.

(57) ABSTRACT

The present invention provides a circuit board having an isolation cover and an assembling method thereof. The circuit board of the present invention comprises a main body and an isolation cover disposed on the circuit board main body. The main body and the isolation cover have a plurality of corresponding first and second positioning portions, and a ground portion is disposed on at least one side of each first positioning portion. The isolation cover is disposed on a first surface of the main body, and each second positioning portion passes through a second surface of the main body and each first positioning portion. An end of each second positioning portion is connected to each ground portion.

16 Claims, 3 Drawing Sheets

CIRCUIT BOARD HAVING ISOLATION COVER AND ASSEMBLING METHOD THEREOF

FIELD OF INVENTION

The present invention relates to a shielding technology capable of eliminating interferences and noises, and more particularly to a circuit board having an isolation cover and an assembling method thereof.

BACKGROUND OF THE INVENTION

With the development of the broadband network and the trend of the digital technology, the wireless products with wireless transceiving functions are increasingly popular, such as a wireless network access point (AP), a mobile phone, a personal digital assistant (PDA), and a notebook computer. As a result, various functions and services are incorporated with wireless technology to provide more convenient and efficient services. But, during the wireless communication, the wireless products are sensitive to the surrounding electromagnetic waves caused by other wireless communication systems or external noises.

For example, when a wireless product performs the data wireless transmission under a high power state, the high frequency harmonic waves are extremely easily generated by non-linear characteristics of active components, so as to result in an electromagnetic interference (EMI) emission, which is often the prime contributor to the performance degradation. In order to solve the problem, legal regulations are imposed by many countries to restraint illegal input applications and utilizations of the wireless product. Accordingly, when the designers and manufactures of the wireless product design a control line of the wireless product, the legal requirements of wireless applications must be complied and incorporated into the wireless design. The circuit of the wireless product is also affected by the signals of the external electromagnetic wave, such as, radio frequency (RF) wireless signals. Therefore, performance inconsistencies can occur easily in the wireless products.

Therefore, it is a critical factor for the designers and developers to know how to effectively eliminate the interference and the noise in order to improve the performance of the wireless products. One of conventional methods is to use an isolation cover disposed on a circuit board to eliminate the interference. As shown in FIG. 1, an isolation cover 22 is fully soldered onto a main body 20 of a circuit board 2 by adopting a surface mount technology (SMT), such that the isolation cover 22 can cover part of components on the circuit board 2, such as, the chip(s) located on a surface of the main body 20 of the circuit board 2. Then, a reflow-soldering process is performed on the circuit board 2 through a tin oven (not shown).

However, this conventional method is used a soldering technique called a single piece fully soldering process to solder the isolation cover 22 entirely onto the circuit board main body 20. After the reflow-soldering process, if some of the components underneath the isolation cover 22 fail, a desoldering process must be performed to detach the isolation cover 22 in order to replace the corresponding components. In this manner, the maintenance is costly, and the repairing process is time consuming, and the surface of the main body 20 of the circuit board 2 can be easily damaged or deformed, more significantly, the detached isolation cover 22 cannot be reused. As a result, the fabrication cost of the conventional method is extremely high.

In order to solve the disadvantage of the single piece fully soldering technology, a two-piece fully soldering technology is proposed, as shown in FIG. 2. A lower frame 24 and an upper cover 26 are used to replace the single piece isolation cover. During assembling, the lower frame 24 is firstly soldered to the main body 20 of a circuit board 2'. The upper cover 26 is utilized to cover the main body 20 of the circuit board 2' after the circuit board 2' passing through the tin oven, in such that the upper cover 26 can be integrated to the lower frame 24.

However, the requirements of performing the two-piece fully soldering process are more complicated, and the cost is relatively higher. At the same time, both the single piece fully soldering technology and the two-piece fully soldering technology require the solder tin to perform the soldering process, and the heat dissipation is the major problem during the soldering process which can severely damage to the components on the circuit board and the circuit board itself., Some conventional methods are proposed to resolve the above-mentioned problems, such as the methods disclosed in PRC Utility Model Patent Publication No. CN201063966Y, and US Patent Publication Application No. 2008/0043453 A1. In the PRC Utility Model Patent Publication No. CN201063966Y, the isolation cover is used to cover the entire circuit board, and an elastic arm with an inward end is designed to clamp the periphery of the circuit board. In the US Patent Publication Application No. 2008/0043453 A1, the surface of the partial circuit board is covered by the isolation cover passing through the circuit board, and an interfering structure with an outward end is designed to fix the isolation cover on the circuit board.

In both teachings, solder tin is not an essential requirement to perform the soldering process. However, the elastic arm or the interfering structure is easily deformed by the high temperature resulted in the subsequent process, thereby affecting the buckling force to cause the falling of the isolation cover.

From the above-mentioned methods, the conventional methods have many problems, therefore, it is an objective of the present invention to provide a true solution to those drawbacks, and an improved circuit board of a communication product and a fabrication method that can successfully eliminate the interferences.

SUMMARY OF THE INVENTION

In view of the disadvantages of the conventional art, the present invention is directed to a circuit board having an isolation cover and an assembling method thereof, so as to lower an assembling complexity.

The present invention is further directed to a circuit board having an isolation cover and an assembling method thereof, which is convenient to maintain.

In order to achieve the above and other objectives, the present invention provides a circuit board having an isolation cover and an assembling method thereof. The circuit board having the isolation cover comprises a main body of the circuit board, and a first surface and a second surface opposite to each other are provided on the main body, a plurality of first positioning portions each having a respective through-hole and penetrating the first and second surfaces, and a plurality of ground portions that respectively correspond to the first positioning portions, the ground portions being disposed to be separated from one another on the second surface and located on at least one side of corresponding first positioning portions; and an isolation cover, including a plurality of second positioning portions, each second positioning portion having a cross section smaller than or equal to a through-hole of a corresponding first positioning portion so as to pass through the corresponding first positioning portion, wherein an end of each second positioning portion passing through the corresponding first positioning portion is bent toward and connected a ground portion that corresponds to the corresponding first positioning portion.

Each first positioning portion is a plated through hole (PTH) in the circuit board, and each of the ground portion is a ground pad. The isolation cover comprises a cover body, and each second positioning portion is located on an edge of the cover body and extended downwards. Each second positioning portion is located on the edge of a corner of the cover body. In addition, a length of each second positioning portion is smaller than or equal to a total length of the corresponding first positioning portion and the ground portion that corresponds to the corresponding first positioning portion, a number of the second positioning portions is either smaller than or equal to that of the first positioning portions, and the end of the second positioning portion passing through the corresponding first positioning portion is flatly attached to the ground portion that corresponds to the corresponding first positioning portion.

The present invention further provides a circuit board having an isolation cover and an assembling method thereof. The assembling method comprises: providing a main body of a circuit board, wherein the main body further includes a first surface and a second surface opposite to each other, a plurality of first positioning portions each having a respective through-hole and penetrating the first and second surfaces, and a plurality of ground portions that respectively correspond to the first positioning portions, the ground portions being disposed to be separated from one another on the second surface and located on at least one side of each first positioning portions; providing an isolation cover, wherein the isolation cover comprises a plurality of second positioning portions, each second positioning portion having a cross section smaller than or equal to a through-hole of a corresponding first positioning portion so as to pass through corresponding first positioning portion; disposing the isolation cover on the first surface, such that each second positioning portions pass through the second surface and the corresponding first positioning portions; and bending an end of each second positioning portion passing through the corresponding first positioning portion to contact with a ground portion that corresponds to the corresponding first positioning portion.

In the assembling method, each second positioning portion is bent first, and then flattened to be in contact with each corresponding ground portion. Alternatively, each second positioning portion can also be directly flattened to in contact with the corresponding ground portion. The end of each second positioning portion passing through the corresponding first positioning portion is flatly attached to the ground portion that corresponds to the corresponding first positioning portion. In addition, each first positioning portion is a plated through hole (PTH), and is plated with a plating layer selected from a group consisting of copper, tin, and nickel.

By comparing with the conventional methods, the end of every second positioning portion of the present invention can pass through the isolation cover of the main body to integrate the isolation cover with the main body of the circuit board. Therefore, unlike the conventional methods, no lower frame or solder tin is required in the present invention to assemble the isolation cover to the main body of the circuit board The end of the isolation cover is in contact with the ground portion located on the second surface of the main body of the circuit board in order to keep a stable positioning effect. Therefore, the present invention provides a method that components can be replaced and repaired easily without the desoldering process, and the maintenance cost is thus drastically reduced.

BRIEF DESCRIPTION OF THE DRAWINGS

The present invention will become more fully understood from the detailed description given herein below for illustration only, and thus are not limitative of the present invention, and wherein:

FIG. 4b is a rear side view of FIG. 4a; and

FIG. 4c is a top view of FIG. 4a.

DETAILED DESCRIPTION OF THE INVENTION

Figure 1:
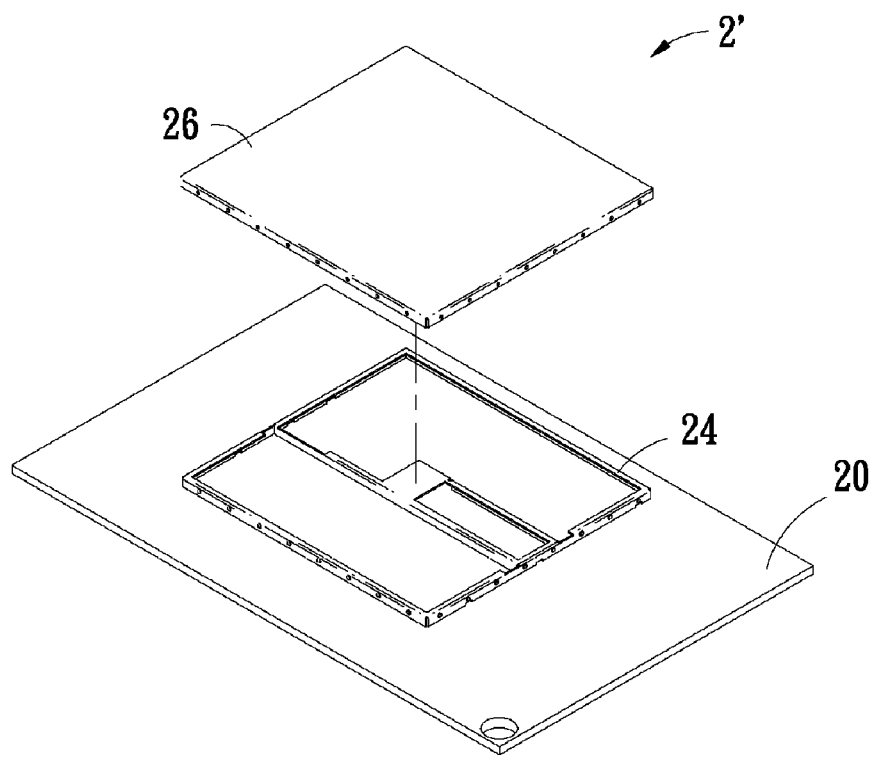
FIG. 1 is a schematic view of a conventional circuit board having a single piece fully soldered isolation cover.
Figure 2:
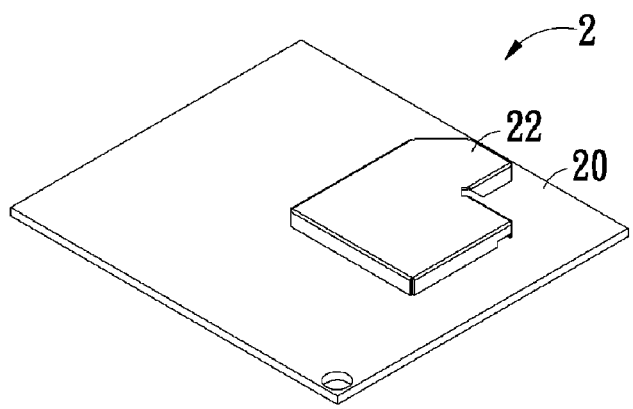
FIG. 2 is a schematic view of a conventional circuit board having a two-piece fully soldered isolation cover.
Figure 3:
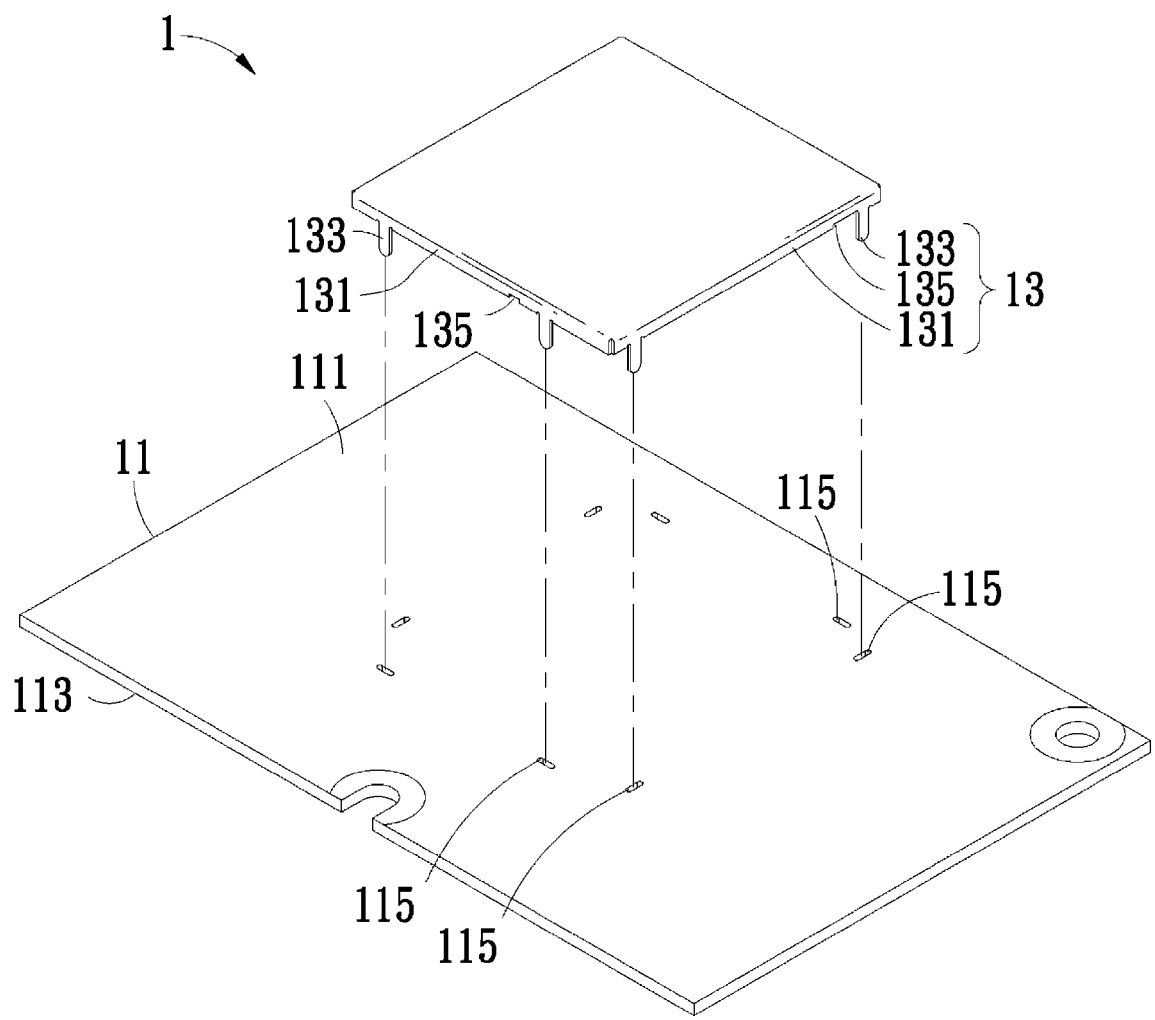
FIG. 3 is a schematic exploded view of a circuit board according to a preferred embodiment of the present invention.
Figure 4B:
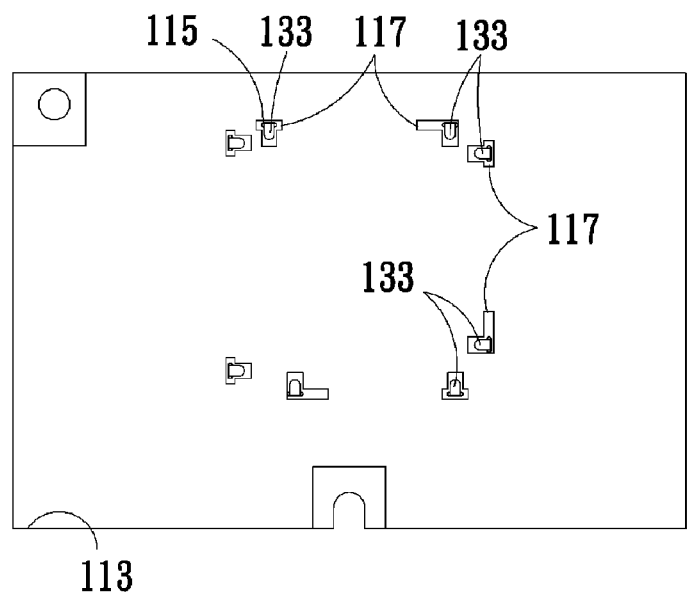
Figure 4C:
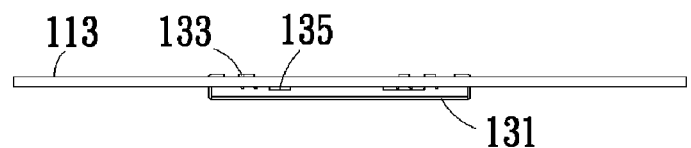

Referring to FIGS. 3 to 4c, schematic views of a circuit board having an isolation cover and an assembling method thereof according to a preferred embodiment of the present invention are shown. As shown in FIG. 3, a circuit board 1 of the preferred embodiment comprises a main body 11 of the circuit board 1 and an isolation cover 13 that is disposed on the main body 11.

The main body 11 has a first surface 111 and a second surface 113 opposite to each other, a plurality of first positioning portions 115 penetrating the first surface 111 and the second surface 113, and a plurality of ground portions 117 respectively disposed on the second surface 113 and located on at least one side of each first positioning portion 115. In the embodiment, each first positioning portion 115 is a through hole, and preferably a plated through hole (PTH), and each first positioning portion 115 is either plated with copper, tin, nickel, or another equivalent plating layer in order to enhance the grounding effect. Each ground portion 117 is a ground pad, and each ground portion 117 is disposed on a sidewall of a hole of the first position portion 115 that is located on the second surface 113. In addition, as shown in FIG. 4b, the ground portions 117 are either having similar shapes or different shapes, for example, a T shape, a L shape, or other equivalent shapes that have the benefits of connecting the end of the isolation cover 13 to the ground portion effectively. As long as the shape of each ground portion 117 is effectively to connect the end of the isolation cover 13 to a contacting surface of the second surface 113 so that the grounding effect is successfully achieved. Thus, the design of the present invention is not restricted to one particular shape.

It should be noted that during the process of manufacturing the circuit board, each first positioning portion 115 and each ground portion 117 are formed simultaneously, and any conventional method can be used for the formation of each first positioning portion 115 and each ground portion 117

The isolation cover 13 comprises a cover body 131, a plurality of second positioning portions 133 located on an edge of the cover body 131 and extended downwards, and at least one opening 135 disposed on a side of the cover body 131. The cover body 131 is, for example, a rectangular-shaped cover body. The cover body of the present invention is designed in such that it does not limit to the rectangular shape, and other shapes are applicable. As shown in FIGS. 3 and 4b, each second positioning portion 133 is, for example, a positioning column, and correspondingly passes through each first positioning portion 115. The edge of each cover body 131 is the edge of a corner of the cover body 131, that is, each second positioning portion 133 is correspondingly disposed on the position near the corner of the cover body 131, and an end of each second positioning portion 133 is bent toward to the ground portion 117. The end (including the part passing through the second surface 133) of each second positioning portion 133 passing through the corresponding first positioning portion is flatly attached to the ground portion 117 that corresponds to the corresponding first positioning portion. However, in other preferred embodiments, the end is partially flatly attached, that is, when it is flatly attached, the grounding effect is the best, but when it is partially flatly attached, the grounding effect can also be achieved. Thus, to achieve the grounding effect, the present invention is not restricted to the flatly attaching method.

The openings 135 are used for heat dissipation. Although four openings 135 that are respectively disposed on sides of the cover body 13 are disclosed. But, the openings 135 of the present invention are not limited to its size, the numbers of openings 135 used and their disposing positions on the circuit board.

The length of each second positioning portion 133 in this embodiment is designed to be smaller than a total length of the corresponding first positioning portion 115 and the ground portion 117 that corresponds to the corresponding first positioning portion 115. In other words, the second positioning portion 133 is passed through the first positioning portion 115, and is protruded from the second surface 113. After being connected to the ground portion 117, the end of the second positioning portion 133 is still located within the scope of each ground portion 117. However, in other preferred embodiments, the length of the second positioning portion 133 is designed to be equal to the total length of the corresponding first positioning portion 115 and the ground portion 117 that corresponds to the corresponding first positioning portion 115. Therefore, the length of the second positioning portion 133 is not limited to one particular measure.

The main body 11 of circuit board 1 and the isolation cover 13 are provided as shown in FIG. 3, wherein the main body 11 has a first surface 111 and a second surface 113 opposite to each other, a plurality of first positioning portions 115 penetrating the first surface 111 and the second surface 113, and a plurality of ground portions 117 respectively disposed on the second surface 113 and located on at least one side of each first positioning portion 115. The isolation cover 13 comprises a plurality of second positioning portions 133 respectively to every corresponding first positioning portion 115.

In the above-disclosed steps, the isolation cover 13 and the main body 11 of the circuit board 1 can be respectively fixed on a pressing jig (not shown), the pressing jig has a jig platform used for providing a pressing support, an aligning mechanism guiding each second positioning portion 133 to every corresponding first positioning portion 115, and a downward pressing structure (not shown) used for uniform downward pressing. The jig platform is used to maintain an appropriate pressing force, thereby preventing the main body 11 of circuit board 1 from twisting.

Figure 4A:
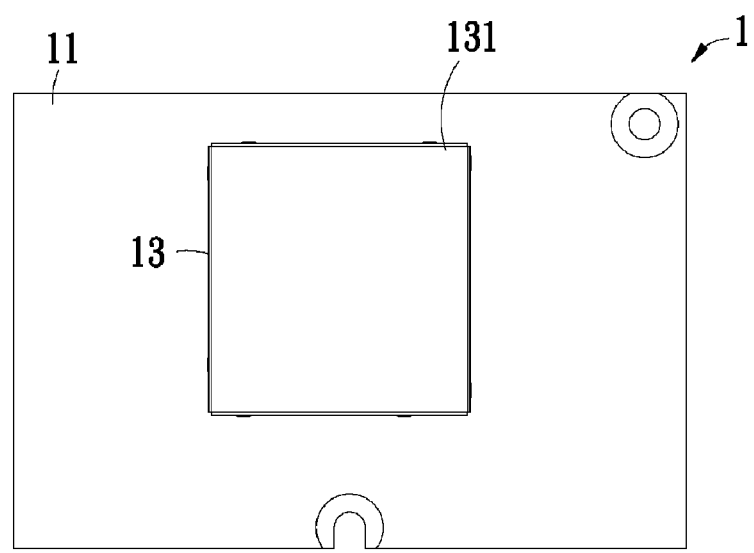
FIG. 4a is an assembled schematic view of the circuit board of FIG. 3.

Next, as shown in FIG. 4a, the isolation cover 13 is disposed on the first surface 111, and each second positioning portion 133 is made to pass through the second surface 113 and each first positioning portion 115. In this step, each second positioning portion 133 is guided to the direction to be bent through the aligning mechanism before pressing.

Then, the end of each second positioning portion 133 is bent to contact with the corresponding ground portion 117. The end of each second positioning portion 133 is bent to be in contact with the corresponding ground portion 117, as shown in FIG. 4b. Here, after each second positioning portion 133 is pre-bent to the appropriate direction, each second positioning portion 133 is flatly attached to the second surface 113 of the main body 11 of the circuit board 1 by using the above-mentioned downward pressing structure, as shown in FIG. 4c. At the same time, in order to achieve a uniform pressing force, the manual pressing is replaced by air pressure pressing or other equivalent manners.

It should be understood that for the pressing jig, the upper and the lower supporting pressing jig structures are replaceable as each product mechanism is different, thereby enhancing the universality. Although the number of the second positioning portions 133 is equal to that of the first positioning portions 115 in this preferred embodiment. However, the number of the second positioning portions 133 can also be smaller than that of the first positioning portions 115. In this manner, the disposition positions of the first positioning portions 115 on the main body 11 of the circuit board 1 are corresponding to different sizes of the isolation covers. In other words, different sizes of isolation covers can be applied to the same circuit board in order to enhance the utility of the circuit board of the invention.

Further, in this preferred embodiment, each second positioning portion is bent first, and then flattened to be in contact with the corresponding ground portion. However, in other preferred embodiments, each second positioning portion is directly flattened in contact with the corresponding ground portion, or each second positioning portion is flattened after passing through each first positioning portion by adopting other methods.

As stated above, the present invention complies with the three requirements for a patentable invention: novelty, inventive-step (non-obviousness) and industrial utilization. The present invention has been disclosed by above preferred examples. However, the persons skilled in the art should understand that these examples just illustrate the present invention but by no means limit the scope of the present invention in any way. It should be also noted that any modification and replacement having equivalent effects to these examples are considered falling into the scope of the present invention, and the scope of the present invention is indicated by the following claims.

What is claimed is:

1. A circuit board having an isolation cover, comprising:
   a main body of the circuit board, including
      a first surface and a second surface opposite to each other,
      a plurality of first positioning portions each being a respective through-hole that penetrates the first and second surfaces, and
      a plurality of ground portions that respectively correspond to the first positioning portions, the ground portions being exposed from the second surface to be spatially separated from one another and located on one side of corresponding first positioning portions; and
   an isolation cover, including
      a plurality of second positioning portions, each second positioning portion having a cross section smaller than or equal to a through-hole of a corresponding first positioning portion so as to pass through the corresponding first positioning portion, wherein
      an end of each second positioning portion passing through the corresponding first positioning portion is bent toward the second surface and flatly attached to a corresponding ground portion that corresponds to the corresponding first positioning portion, so that each second positioning portion is electrically connected to the corresponding ground portion through the flatly attached end.

2. The circuit board according to claim 1, wherein the first positioning portions are plated through holes (PTH).

3. The circuit board according to claim 1, wherein each of the ground portions is a ground pad.

4. The circuit board according to claim 1, wherein
the isolation cover further includes a cover body, and
each second positioning portion is located on an edge of the cover body and extended downwards.

5. The circuit board according to claim 4, wherein each second positioning portion is located on the edge of a corner of the cover body.

6. The circuit board according to claim 1, wherein a length of each second positioning portion is smaller than or equal to a total length of the corresponding first positioning portion and the corresponding ground portion.

7. The circuit board according to claim 1, wherein a number of the second positioning portions is smaller than or equal to a number of the first positioning portions.

8. The circuit board according to claim 1, wherein each second positioning portion is electrically connected to the corresponding ground portion only through the flatly attached end.

9. The circuit board according to claim 1, wherein interferences and noises are eliminated via the flatly attached end.

10. An assembling method of a circuit board having an isolation cover, comprising:
providing a main body of the circuit board, wherein the main body of the circuit board includes a first surface and a second surface opposite to each other, a plurality of first positioning portions each being a respective through-hole that penetrates the first and second surfaces, and a plurality of ground portions that respectively correspond to the first positioning portions, the ground portions being exposed from the second surface to be spatially separated from one another and located on one side of corresponding first positioning portions;
providing an isolation cover, wherein the isolation cover comprises a plurality of second positioning portions, each second positioning portion having a cross section smaller than or equal to a through-hole of a corresponding first positioning portion so as to pass through the corresponding first positioning portion;
disposing the isolation cover on the first surface, such that each second positioning portion passes through the second surface and the corresponding first positioning portion; and
bending toward the second surface an end of each second positioning portion passing through the corresponding first positioning portion and flatly attaching the end of each second positioning portion to a corresponding ground portion that corresponds to the corresponding first positioning portion, so that each second positioning portion is electrically connected to the corresponding ground portion through the flatly attached end.

11. The assembling method according to claim 10, wherein each second positioning portion passing through the corresponding first positioning portion is bent first, and is then flattened to be in contact with the corresponding ground portion.

12. The assembling method according to claim 10, wherein each second positioning portion passing through the corresponding first positioning portion is directly flattened to be in contact with the corresponding ground portion.

13. The assembling method according to claim 10, wherein each first positioning portion is a plated through hole (PTH).

14. The assembling method according to claim 13, wherein each first positioning portion is plated with a plating layer selected from a group consisting of copper, tin, and nickel.

15. The assembling method according to claim 10, wherein each second positioning portion is electrically connected to the corresponding ground portion only through the flatly attached end.

16. The assembling method according to claim 10, wherein interferences and noises are eliminated via the flatly attached end.

* * * * *